United States Patent [19]
Philipossian et al.

[11] Patent Number: 5,256,060
[45] Date of Patent: Oct. 26, 1993

[54] REDUCING GAS RECIRCULATION IN THERMAL PROCESSING FURNACE

[75] Inventors: Ara Philipossian, Stoneham; Edward W. Culley, Leominster, both of Mass.

[73] Assignee: Digital Equipment Corporation, Maynard, Mass.

[21] Appl. No.: 827,003

[22] Filed: Jan. 28, 1992

[51] Int. Cl.⁵ .................................. F27D 3/00
[52] U.S. Cl. .......................... 432/152; 432/253; 432/6
[58] Field of Search .............. 432/5.6, 152, 253, 241

[56] References Cited

U.S. PATENT DOCUMENTS

| | | | |
|---|---|---|---|
| 3,338,209 | 8/1967 | Bhola | 118/49.5 |
| 4,347,431 | 8/1982 | Pearce et al. | 219/390 |
| 4,459,104 | 7/1984 | Wollmann | 432/123 |
| 4,526,534 | 7/1985 | Wollmann | 432/11 |
| 4,543,059 | 9/1985 | Whang et al. | 432/11 |
| 4,732,110 | 3/1988 | Parsons | 118/719 |
| 4,943,234 | 7/1990 | Söhlbrand | 432/253 |
| 4,950,156 | 8/1990 | Philipossian | 432/253 |
| 4,955,808 | 9/1990 | Miyagawa | 432/6 |
| 4,992,044 | 2/1991 | Philipossian | 432/152 |
| 5,064,367 | 11/1991 | Philipossian | 432/6 |

*Primary Examiner*—Henry C. Yuen
*Attorney, Agent, or Firm*—Arnold, White & Durkee

[57] ABSTRACT

A tube furnace used for high-temperature processing of semiconductor wafers or the like employs features to improve the gas flow. One feature is reducing, or essentially eliminating, regions of gas recirculation in the outer annular region inherently present in a horizontal hot-wall atmospheric oxidation reactor equipped with a tubular cantilever for holding semiconductor wafers. The annular region is effectively isolated from the rest of the reactor by a solid circular quartz ring or barrier formed on the inner wall of the furnace tube, acting as a physical barrier against gas penetration inside the outer annulus.

17 Claims, 5 Drawing Sheets

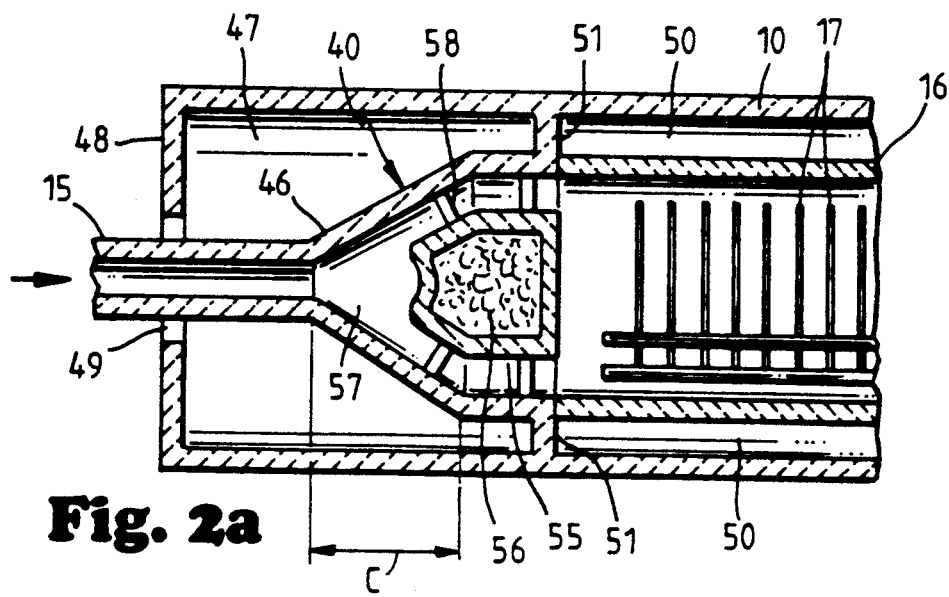
Fig. 2a
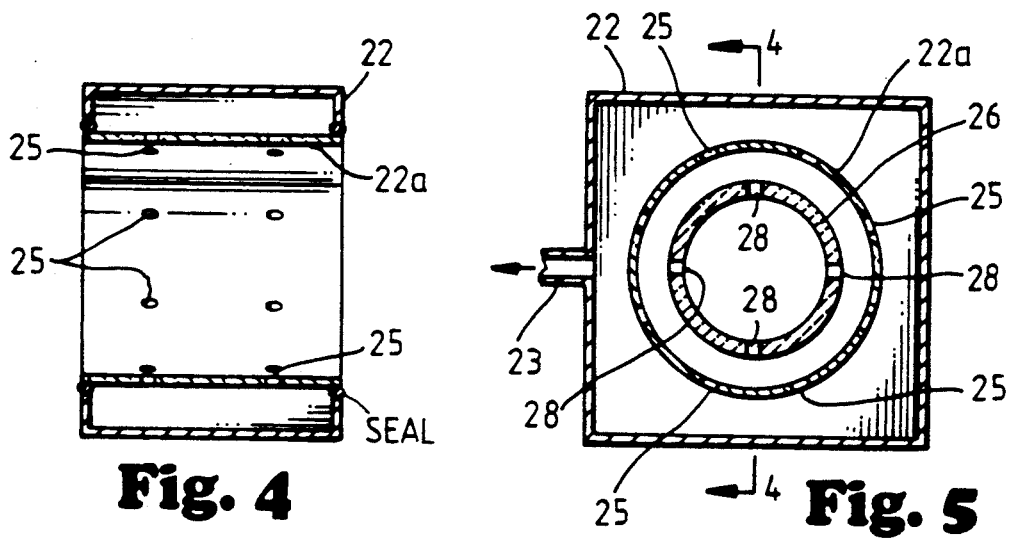
Fig. 4
Fig. 5
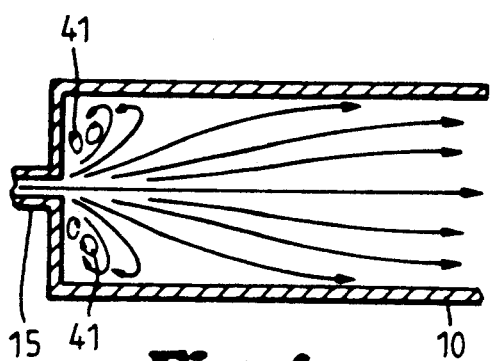
Fig. 6
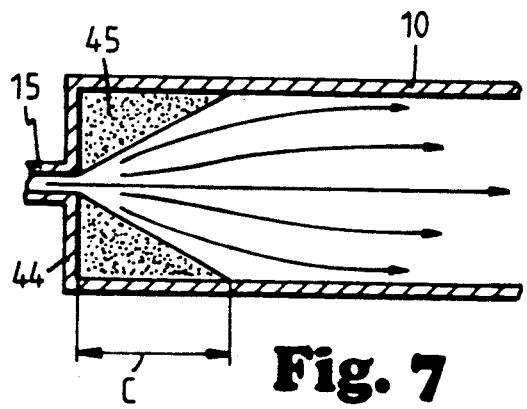
Fig. 7

5,256,060

REDUCING GAS RECIRCULATION IN THERMAL PROCESSING FURNACE

RELATED CASES

This application discloses matter also disclosed in our copending patent application Ser. No. 826,860, filed concurrently herewith, assigned to Digital Equipment Corporation, assignee of this invention.

BACKGROUND OF THE INVENTION

This invention relates to semiconductor processing equipment, and more particularly to apparatus for performing high-temperature processes upon semiconductor wafers in a tube furnace.

Thermal processing equipment for processing semiconductor wafers is described in U.S. Pat. Nos. 4,950,156, 4,992,044 and 5,064,367, issued to Ara Philipossian and assigned to Digital Equipment Corporation. These patents describe a tubular cantilever construction where semiconductor wafers are protected from exposure to ambient air and particulates. Oxygen, water vapor and airborne particulates found in ambient air can react with the wafers and adversely affect their chemical and physical properties. By means of a tubular cantilever into which the loaded wafer boats are inserted, the wafers are protected against particulates, and, by flowing an inert gas through the tube, also protected from moisture and air. The tubular cantilever also reduces the amount of contaminants seen by the wafers inside the furnace tube itself since the wafer is isolated by the tubular cantilever from the walls of the furnace tube. Various furnace design improvements as described in these patents assure a uniform flow of the reaction gases through the furnace tube to prevent contaminants from entering the reaction tube and adversely affecting the wafers, and to ensure efficient removal of the gases fed to the furnace.

In U.S. Pat. No. 4,950,156, an inert gas curtain is described for reducing the amount of ambient air allowed to enter the furnace during the time the tubular cantilever is removed. U.S. Pat. No. 4,992,044 discloses an exhaust system for removing spent gases from one end of the tubular cantilever in a symmetrical manner. U.S. Pat. No. 5,064,367 describes a conical gas inlet for a tubular processing system to reduce gas recirculation and eddys.

In the thermal processing systems disclosed in each of the U.S. Pat. Nos. 4,950,156, 4,992,044 and 5,064,367, a tubular cantilever containing the wafers to be processed is inserted concentrically within a furnace tube, so that an annular space exists between the outer wall of the tubular cantilever and the inner wall of the furnace tube. The spacing must be sufficient to allow free movement of the tubular cantilever in and out of the furnace tube without mechanical interference. During the wafer processing operation, this annular space becomes part of the dead space inside the furnace that must be filled with inert or reactant gases, but the space does not contribute any useful processing function since it is too far removed from the wafers themselves.

A particular construction of a tubular cantilever for use in thermal processing equipment for semiconductor wafers is disclosed in U.S. Pat. No. 4,543,059, issued to Whang and Wollmann. In the cantilever reactor of U.S. Pat. No. 4,543,059, an inherent part of the geometry is that an outer annular region is created within the reactor (between the inner wall of the furnace tube and the outer wall of the cantilever). Depending on the maximum allowable wafer diameter, and the baffle configuration, this region can account for a significant fraction of the total volume of the reactor. Furthermore, the patent shows that the annular region should be equipped with its own exhaust so as to cause minimal disruption of gas flow within the reactor and to ensure efficient gas purging. In an attempt to address this issue, the patentees disclose a bypass tube having a cross sectional area which is roughly ten percent of the main exhaust port. The patentees assumed that roughly ten percent of the total flow rate would enter the outer annular region and be effectively exhausted through the bypass tube. Subsequently, however, residual gas analysis in conjunction with the residence time distribution technique, conducted by the assignee herein, shows that the bypass design of U.S. Pat. No. 4,543,059 is essentially ineffective in ensuring satisfactory fluid dynamics within the outer annular region. Two independent approaches verify this.

The first approach uses the residence time distribution technique to determine the mean residence time of gas molecules in the outer annulus of a reactor containing a varying number of baffles in its main chamber. Theoretically, for an open system (i.e. a system which has an inlet and an outlet) placing more baffles in the main reactor chamber should increase the flow resistance in the main chamber, thus forcing more gas through the outer annulus. Therefore, a five-baffle system is expected to have a greater outer annular flow rate compared to three- and one-baffle systems, respectively. Since mean residence time and flow rate are inversely proportional, the addition of more baffles in the main chamber should result in smaller mean residence times in the outer annular region (again, assuming that the outer annular region is independently exhausted). But the results of analysis indicate this not the case. For a given flow rate (flow rate at several differing levels) only very slight differences in the mean residence time as a function of baffle configuration were noted, these differences being well within the margin of experimental error. The results imply that the outer annular region lacks its independent exhaust (i.e. the bypass is not operating efficiently). A great majority of the gases entering the outer annulus, exit that region after some time, by backing off through the outer annulus and re-entering the main chamber. The gases finally leave the reaction system via the main exhaust port.

The second, more direct, approach involved comparing the mean residence time of gases in the outer annulus of a conventional cantilever-equipped, furnace (i.e. bypass tube according to U.S. Pat. No. 4,543,059) with a reactor having a completely plugged bypass tube. The results indicate that there are no marked difference in the outer annular mean residence times between the two configurations. This again shows that the bypass tube is not effective in offering independent exhaust capability to the outer annular region.

Accordingly, one of the objectives of the reactor to be described herein is to avoid the problems inherent in the reactor design of the U.S. Pat. No. 4,543,059 in regard to recirculation of gas from an annular space between inner walls of the furnace and outer walls of the cantilever tube. Another objective is concerned with improving plug flow characteristics.

Continuous flow reactors are of two kinds, plug flow reactors, and continuously stirred tank reactors (CSTR). Plug flow reactors assume complete mixing in the radial direction, but allow for no diffusion/dispersion in the longitudinal (axial) direction. As a result, the compositional profiles are uniform over any cross-sectional area perpendicular to the flow. The CSTR is the opposite extreme of the plug flow reactor. The essential feature of a CSTR is the assumption of complete uniformity of concentration throughout the reactor. In CSTRs, the concentration in the effluent stream is equivalent to the concentration everywhere within the vessel. In order to approach this ideal mixing pattern, it is necessary that the feed be intimately mixed with the contents of the reactor in a time interval that is very small compared to the mean residence time of fluids flowing through the vessel. Given the highly ideal nature of both types of reactors, it should be noted that both systems can achieve perfect growth rate uniformity in a silicon oxidation furnace. The furnaces herein described are necessarily operated in the plug flow mode, so the CSTR will not be treated further.

It can be demonstrated that a high degree of $SiO_2$ growth rate uniformity can be achieved in a plug flow reactor. Even though the first and last wafers in the reactor experience the approaching oxygen boundary (the "plug" of oxygen flowing through the system) at different points in time, both wafers undergo identical compositional exposures to oxygen for identical amounts of time. A model of a thermal processing furnace, using flow visualization studies, illustrates that conventional furnaces (whether equipped with cantilever loading or not) exhibit conditions which are far from those of ideal CSTR or plug flow reactor conditions. Also, it is seen that attaining ideal CSTR conditions is near impossible due to the large length-to-width ratio associated with thermal furnaces.

An inherent problem associated with most prior thermal processing furnaces is the fact that the reactant gas jet which enters the reaction vessel through the injector nozzle has a characteristic elongated shape which extends approximately one-third of the way through the reactor. This undesirable feature induces unwanted turbulence within the system and causes premature and incomplete local mixing of reactant gases in the longitudinal direction. Any effort to prevent this longitudinal thrust should result in a flow pattern which approaches plug flow conditions and should help ensure that the entire wafer load is exposed to uniform compositional conditions within the reactor.

SUMMARY OF THE INVENTION

In accordance with one embodiment of the invention, a tube furnace used for high-temperature processing of semiconductor wafers or the like employs features to improve the gas flow. One feature is reducing, or essentially eliminating, regions of gas recirculation in the outer annular region inherently present in a horizontal hot-wall atmospheric oxidation reactor equipped with a tubular cantilever for holding semiconductor wafers. The annular region is effectively isolated from the rest of the reactor by a solid circular quartz ring or barrier formed on the inner wall of the furnace tube, acting as a physical barrier against gas penetration inside the outer annulus. Another feature, the subject of copending application Ser. No. 826,860, is improving the plug flow characteristics of the furnace by preventing the undesirable elongation of the gas jet entering the reaction system through the injector nozzle. Ibis elongated gas jet induces unwanted turbulence within the system and causes premature and incomplete mixing of reactant gases in the longitudinal direction. Improvement in plug flow characteristics is attained by use of a quartz baffle at the entrance region of the reactor located a distance from the gas inlet. The shape and location of the baffle are such that it acts as a physical barrier against the elongated gas jet and confines the turbulence in the initial fill chamber created by the entrance region of the reactor and the baffle.

BRIEF DESCRIPTION OF THE DRAWINGS

The novel features believed characteristic of the invention are set forth in the appended claims. The invention itself, however, as well as other features and advantages thereof, will be best understood by reference to a detailed description of a specific embodiment, i.e., a tubular cantilever system, which follows, when read in conjunction with the accompanying drawings, wherein:

FIG. 2a is an enlarged sectional view of a portion of FIG. 2, showing the gas inlet part of the furnace in more detail;

FIG. 4 is a perspective view of the scavenger box of FIGS. 1 and 2;

FIG. 5 is an elevation view in section of the scavenger box seen in FIGS. 1, 2 and 4, taken along the line 5—5 in FIG. 2;

FIG. 6 is an elevation view in section of a gas inlet nozzle for a tube furnace according to the prior art;

FIG. 7 is an elevation view in section of a gas inlet nozzle for a tube furnace according to an alternative method of construction for one embodiment of the invention;

DETAILED DESCRIPTION OF SPECIFIC EMBODIMENT

Figure 1:
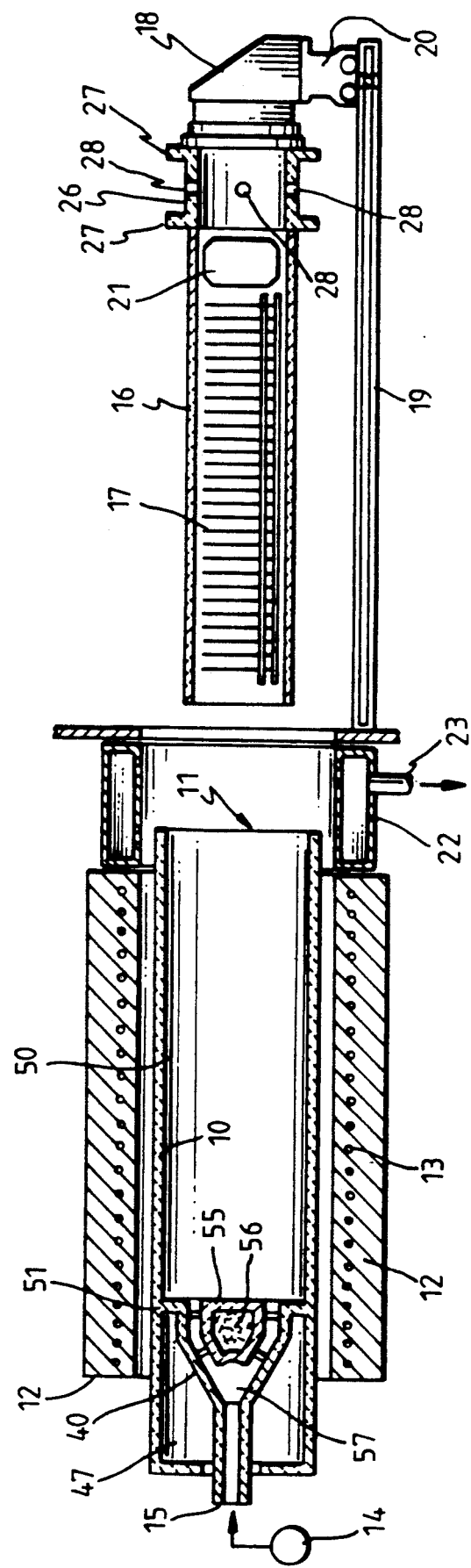
FIG. 1 is an elevation view in section of an atmospheric thermal processing furnace having a tubular cantilever in which features of the invention may be implemented, the furnace in this view being in a condition where the tubular cantilever is outside the furnace.

Although the following description and the drawing refer specifically to one embodiment of a furnace of the invention having a tubular cantilever for carrying the wafers, the features of the invention can be used with other thermal processing furnaces, as will be known to one skilled in the art.

Figure 2:
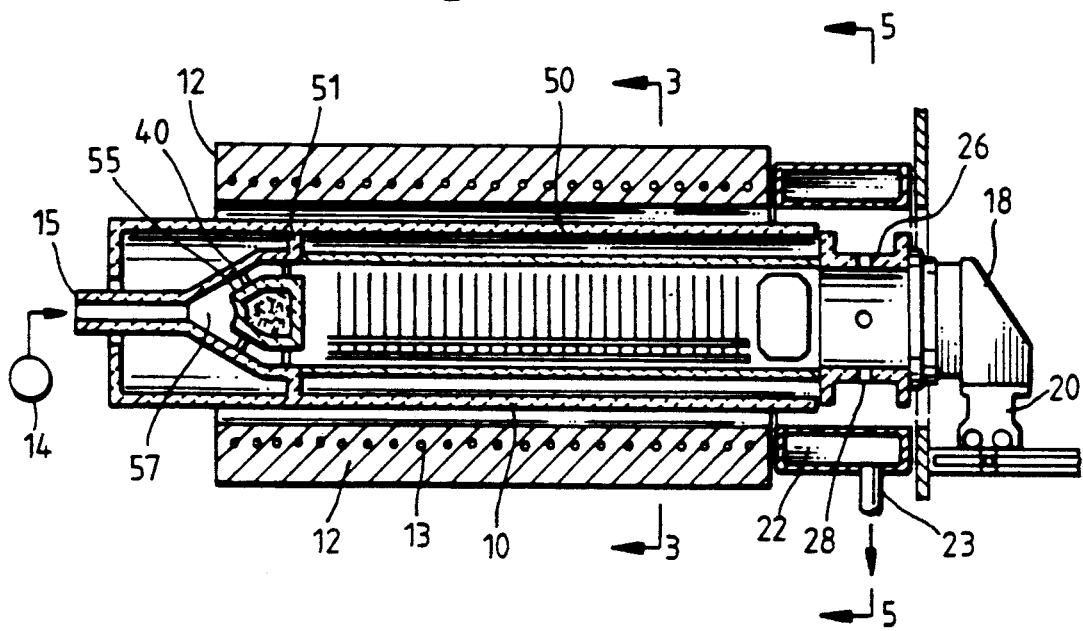
FIG. 2 is an elevation view in section of the furnace of FIG. 1, the furnace in this view being in a condition where the tubular cantilever is inside the furnace.
Figure 3:
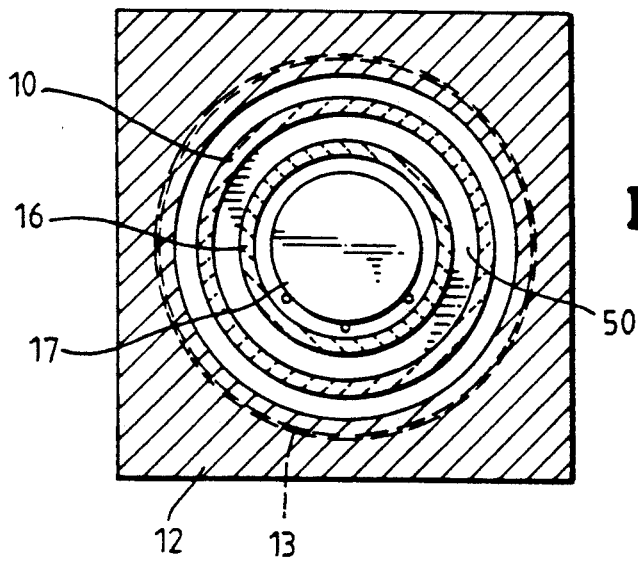
FIG. 3 is an elevation view in section of the apparatus of FIG. 2, taken along the line 3—3 in FIG. 2.

Referring to FIGS. 1, 2, 2a and 3, a furnace for processing semiconductor wafers is illustrated according to features of one embodiment of the invention. This assembly includes an elongated cylindrical quartz furnace tube 10 located inside a cylindrical opening 11 of a diffusion furnace 12 or the like. The diffusion furnace 12 typically includes heater elements 13 of the resistance type functioning to raise the temperature within the furnace to an elevated level of perhaps 800° C. to about 1150° C. for performing some step of a semiconductor manufacturing process, such as diffusion, LPCVD (low pressure chemical vapor deposition), oxide growth, annealing, or the like. A source 14 switchable between reactant and inert gas is connected to an inlet 15 at one end of the tube 10 to provide the desired atmosphere within the tube at various times in the operating cycle. Since the apparatus in one embodiment is intended to accommodate 6-inch diameter silicon wafers, the furnace tube 10 has a diameter of about 10-inch, although the particular size is selected according to the intended use of the system. A quartz tubular cantilever 16 holds a large number of these silicon wafers 17, and this tube is moved to a position out of the furnace as seen in FIG. 1 for loading or unloading the wafers or to a position within the furnace as seen in FIG. 2 for performing the high-temperature furnace operation; this position of FIG. 2 is also used for idling the furnace system for extended times, in which case there are no wafers 17 in place. The tubular cantilever 16 is supported at its outward end by a fixture 18 mounted on a track 19 by a slidable dolly 20. Construction of the tubular cantilever and track mechanism is disclosed in the above-mentioned U.S. Pat. Nos. 4,459,104 and 4,543,059.

While the tubular cantilever 16 is within the furnace as seen in FIG. 2, gas flow from the inlet 15 moves in the left-to-right direction indicated by arrows through the tube 16 to provide the desired atmosphere for the reaction or deposition intended. The composition of this gas is selected by the gas source 14 in accordance with the usual practice. Baffles 21 are positioned in the tubular cantilever 16 on either or both sides of the wafers 17 to retard loss of heat and to ensure adequate reactant mixing, but yet to allow free flow of reactant gases; these baffles also provide the function of reducing the volume of reactant gas needed during the process since the net volume within the furnace is reduced by the baffles. Although a particular embodiment is shown in the drawing, many other baffle arrangements are known and can be substituted by one skilled in the art.

The spent or exhaust gases are collected in a scavenger box 22, as disclosed in U.S. Pat. No. 4,992,044, for which an outlet 23 is maintained at below-ambient pressure so that effluent reactant gases will be drawn into the scavenger box 22 rather than leaking out into the ambient outside the furnace. When the tubular cantilever 16 is in the outmost position, as seen in FIG. 1, the face of the furnace is open and ambient air or gas can enter the tube furnace; the scavenger box also tends to draw this ambient air or gas into the scavenger box 22 for exhaust by the outlet 23 rather than allowing it to reach the furnace tube 10. Ambient air, aside from being reactive, contains high levels of particulates and other contaminants, so steps should be taken to prevent it from entering the furnace tube. The scavenger 22 is intended for exhausting reactant gas when the furnace is in the condition of FIG. 2, but it also functions to some extent in exhausting air entering the open end while in the FIG. 1 condition, although the scavenger is not very efficient in this regard.

As explained in U.S. Pat. No. 4,992,044, it is important that radial symmetry be provided for the gas flow into the scavenger box 22 from the interior of the tubular cantilever 16. To this end, as illustrated in the detail view of FIG. 4, the openings for the flow of gas are a symmetrical array of openings 25 arranged in two cylindrical rings or bands, with the bands spaced apart by about a 4-inch distance. In one embodiment, there are sixteen of these openings 25, arrayed in two bands of eight each. The number and size of openings, their spacing, etc., are dependent upon the particular size of the furnace, gas flow rates, and the like. The openings 25 are formed in a cylindrical quartz inner liner 22a of the scavenger box 22; the fact that this section is made of quartz reduces contamination considerably, since a stainless steel tube would be susceptible to corrosion due to exiting chlorine-containing chemicals and thus would cause a contamination concern. The ends of the scavenger box 22 must be sealed so as to be airtight to prevent gases from exiting the scavenger box 22 from any channel other than the openings 25.

Referring again to FIG. 1, at the outer end of the tubular cantilever 16 is a cylindrical quartz section 26 having a pair of flanges 27, serving as an extension of the tubular cantilever 16, and this section has a number of symmetrically-disposed openings 28, also seen in the section view of FIG. 5, which provide radially-symmetrical flow of exhaust gases, acting together with the two rows of openings 25 of the scavenger box 22. In the example embodiment four of these openings 28 are provided, although their particular number, size and configuration, i.e., the number of bands or rings, are dependent upon the factors mentioned above. When the tubular cantilever 16 is inside the furnace 12 as seen in FIGS. 2 or 5, the openings 28 in the end-section 26 are axially positioned about half-way between the positions of the openings 25 in the scavenger box 22.

According to a feature disclosed in U.S. Pat. No. 4,950,156, a symmetrical manifold collar (not shown) may surround the end of the furnace tube 10 and provide symmetrical injection of a curtain inert gas such as nitrogen gas. This injection would occur when the tubular cantilever 16 is in the outermost position as seen in FIG. 1, or is being moved to or from the position of FIG. 2. The inert gas, e.g., nitrogen, exiting from the inner edge of this manifold collar, if used, forms a barrier or curtain, and the gas so introduced is drawn out by the scavenger box 22 through the two sets of openings 25. Inert gas would also be forced through the furnace tube 10 at this time from the inlet 15, so the interior of the tube 10 is at a higher pressure than the ambient and the interior of the scavenger box 22; these pressure differentials along with the curtain effect are such that ambient air entering the open end of the furnace will not reach the interior of the furnace tube 10 but instead will be harmlessly drawn out by the scavenger box 22.

According to a feature disclosed in U.S. Pat. No. 5,064,367, the embodiment of FIGS. 1, 2 and 2a employs a conical inlet, although it is understood that features of this invention are applicable as well to embodiments not using this conical form. The shape of the inlet end of the quartz furnace tube 10, between the gas inlet 15 and the main cylindrical body of the tube 10 where the wafers will reside, defines a cone-like shape 40. Ibis shape suppresses the formation of recirculating gas cells 41 near the point of injection which form when the inlet 15 admits directly to a cylindrical tube as seen in FIG. 6. That is, the flow of gas passing the sharp comers of the inlet of FIG. 6 results in the formation of recirculating gas cells 41 which form close to the walls of the cylindrical reactor, making it harder to purge the tube when changing from one gas flow to another. The abrupt change in velocity of the incoming gas is illustrated by comparing the cross-sectional area $A_1$ of the inlet 15 to the area $A_2$ of the furnace tube 10; the gas flow obeys the relationship $A_1*V_1=A_2*V_2$ so that if the area $A_2$ is one hundred times that of $A_1$ then the velocity within the inlet 15 will be one hundred times that in the furnace tube 10. This abrupt change is velocity, as well as physical shape and change in volume due to the pressure differential, results in the formation of the recirculating gas cells 41. Also, in going from a pre-oxidation interval to an oxidation step, or in going from an oxidation interval to a post-oxidation step, when the furnace is being used for oxidizing the wafers 17, the improved purging capability of the conical section 40 will reduce the time of process gas overlaps. As has been determined by the prior work of others, the optimum shape for suppressing re-circulation cells of entering reactant gases is obtained by increasing the curvature of the sidewalls of the nozzle in the direction of theoretical flow streamlines.

The conical-like shape 40 in a preferred embodiment extends an axial length "c" as seen in FIG. 7; the length "c" is at least about a length which exceeds the diameter of the tube 10. Particularly, in one embodiment, the length "c" is about 12-inches when the diameter of the tube furnace is 10-inches. The angle between the conical walls in the section 40 and the axis of the tube 10 is about 30° or less in a preferred embodiment. The conical-like shape 40 can be obtained by shaping the quartz tube 10 itself to the desired configuration, or alternatively as seen in FIG. 7 the furnace tube 10 can be cylindrical with a flat end 44, and filler material 45 of quartz or other material added to create the conical-like shape needed for optimum gas flow.

It is preferable to maintain the outer cylindrical-like geometry of the quartz furnace tube 10 as illustrated in FIG. 7, rather than the tube 10 itself having a conical shape, because, from a mechanical standpoint, the cylindrical shape is less susceptible to breakage. Also, from a thermal standpoint, it is common practice to pack the nozzle end of furnace tubes with an insulating material to minimize heat losses from the rear of the furnace. Packing cylindrical-shaped tubes is with insulating materials is much easier and more thermally efficient. Furthermore, since most furnaces are constructed for using cylindrical-shaped furnace tubes, the shape of FIG. 7 is more consistent with current furnace hardware.

Manufacturing the nozzle shown in FIG. 7 may be fairly labor intensive and will require a large amount of quartz material as the filler 45 to be able to effectively fill the space inside the tube and make it conical. Furthermore, such a tube would have a large mass and may act as a source of heat dissipation, or at least create thermal inertia. A preferred construction of the conical nozzle of the furnace tube is shown in FIGS. 1 and 2a, where the tube 10 is of cylindrical shape all the way to the end, but has a conical insert 46 to create a same inner conical geometry as FIG. 7, to which the inlet 15 is integrally formed, but leaving a hollow interior annular chamber 47. This construction is much lighter since it does not need the filler 45, is easier to construct, and does not have the heat dissipation or inertia that the embodiment of FIG. 7 would have. It is preferable that the end piece 48 of the cylindrical tube 10 does not join with the inlet 15 but instead leaves an annular opening 49 so the chamber 47 is not sealed; if the chamber 47 were sealed then the gases inside the chamber would expand and crack the tube 10, and also the opening 49 is large enough to allow cleaning liquids to drain out when the furnace tube 10 has been removed and is being cleaned in a conventional tube etcher. If the opening 49 is not left, i.e., the end piece 48 extends all the way to the inlet 15, sealing the chamber 47, then the chamber must be evacuated during construction to leave a vacuum.

A primary feature of the present invention is reducing or eliminating gas recirculation which results from an outer annular space 50 between the furnace tube 10 and the tubular cantilever 16. A furnace constructed according to U.S. Pat. No. 4,992,044, or according to U.S. Pat. No. 4,543,059, has an outer annular region which comprises a significant fraction of the total void volume of the reactor, and so it is advantageous to prevent that region from taking part in the overall fluid dynamics of the reactor. This allows significant reductions in gas flow rate (hence significant reductions in operating costs), without compromising the overall mean residence time of the system.

The outer annulus 50 is effectively isolated by incorporating a solid circular quartz ring 51 (the ring may take on various shapes) into the inner wall of the oxidation tube 10 located a certain distance from the source end of the reactor. In a minimum design, the inner diameter of the quartz ring 51 should be slightly smaller than the outer diameter of the cantilever tube 16 so as to physically block the entrance of process gases into the outer annulus 50. Moreover, there should be a tight quartz-to-quartz contact between the ring 51 and the cantilever 16 (i.e. the ring-to-cantilever opening should be zero inches). This can be easily attained by adjusting the limit switch of the boat loader at an appropriate longitudinal location on the boatloader track 19 so that it will shut the boatloader motor off at the exact time when the cantilever 16 and the ring 51 are engaged.

In order to prevent ambient air infiltration inside the outer annular region 51, it is preferred that the tube-to-cantilever opening at the loading end be also maintained at zero inches. Moreover, it is preferred that this invention be used in conjunction with the reactant exhaust system including the scavenger 22 described in U.S. Pat. No. 4,992,044 so as to ensure symmetric exhaust and minimal air infiltration inside the reactor.

Figure 8:
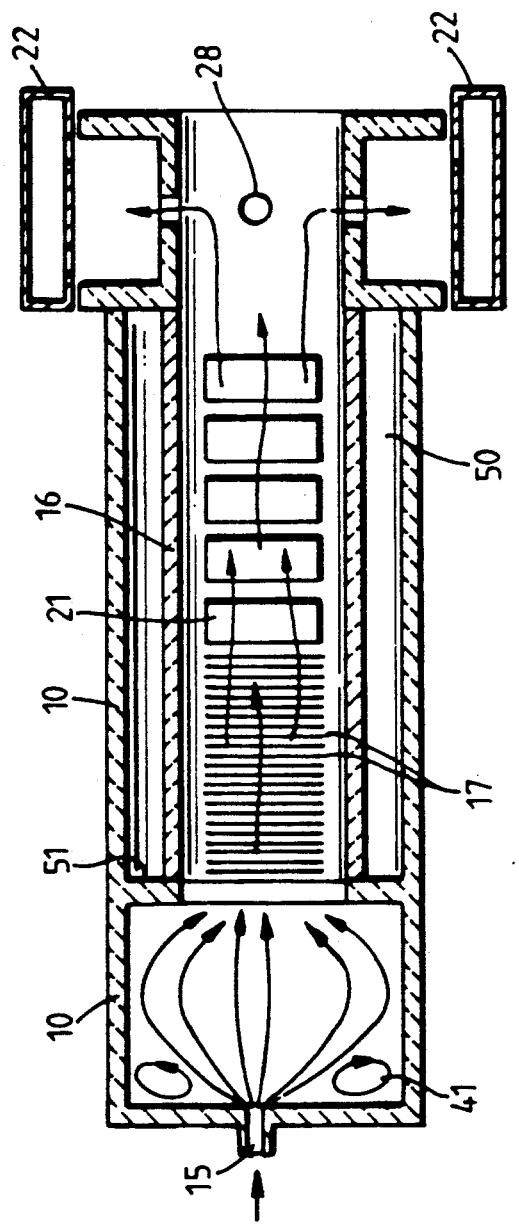
FIG. 8 is an elevation view in section of a furnace similar to FIG. 1, according to another alternative method of construction of the barrier ring employing a squared shape rather than with a conical inlet.
Figure 9B:
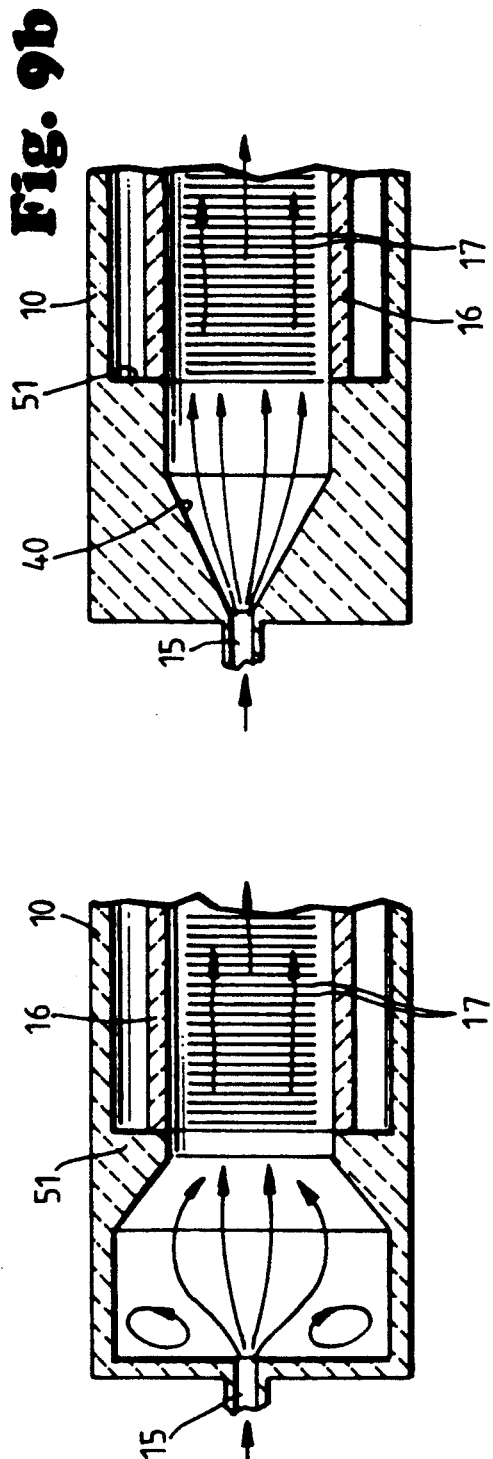
FIGS. 9a and 9b are elevation views in section of a furnace similar to FIGS. 1 or 8, according to other alternative methods of construction of the barrier ring.
Figure 9A:
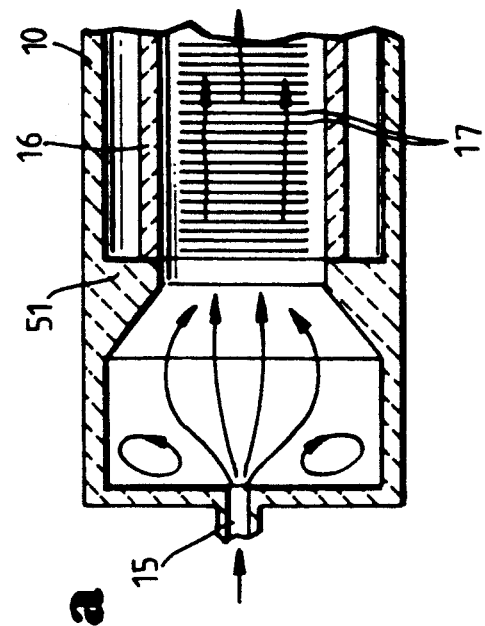

Various shapes can be used to improve the fluid dynamics around the quartz ring 51. These include a square cross section of FIG. 8, as well as a tapered cross section of FIG. 9a. Perhaps the most effective design is one that combines the conical inlet design 40 disclosed in U.S. Pat. No. 5,064,367 with a ring-like obstruction 51 to not only provide effective gas inlet jet characteristics, but to provide effective isolation of the outer annulus as well, as seen in FIG. 1 or FIG. 9b. As mentioned above, the conical section 40 need not be constructed of solid quartz as seen in FIGS. 7 or 9b and may have a hollow configuration. Again, the exact shape of the inner wall of the conical section may vary depending on the application, the desired flow rate, and the overall dimensions of the furnace.

According to a feature of copending application Ser. No. 826,860, filed herewith, improvement in plug flow characteristics of the furnace of FIGS. 1 and 2a is attained by incorporating a quartz baffle 55 at the entrance region of a thermal processing furnace. The baffle is located a distance from the inlet of the gas jet at the source end of the reactor. The shape and location of the baffle 55 are such that it acts as a physical barrier against the elongated gas jet from the inlet 15 and confines the turbulence in the initial fill chamber created by the entrance region of the reactor and the baffle. The baffle 55 may be solid or hollow. In the case of a hollow baffle, it is first filled with quartz wool 56 (for improved thermal characteristics) and then evacuated (so that it will not explode when heated inside the furnace). A hollow baffle 55 is preferred since it will weigh much less than a solid quartz baffle.

Flow visualizations inside a model thermal processing furnace have shown that the baffle 55 is quite effective in suppressing gas jet elongation and reduces longitudinal turbulence within the reactor. This is achieved by having the baffle act as a physical barrier against the elongated gas jet, which then confines the turbulence in the initial fill chamber 57 created by the entrance region of the reactor and the baffle 55.

In order to facilitate the transport and handling of the reaction tube 10, and to also minimize the time spent on setting the tube 10 up in the furnace 12, it is preferred to have the baffle 55 directly fused onto the inner wall of the reaction tube 10. Two rows of support rods 58, having a total of two rods per row, can be used to hold the baffle 55 inside the reactor. The proximity of the baffle 55 to source end of the reactor will depend on the process conditions.

Figure 10A:
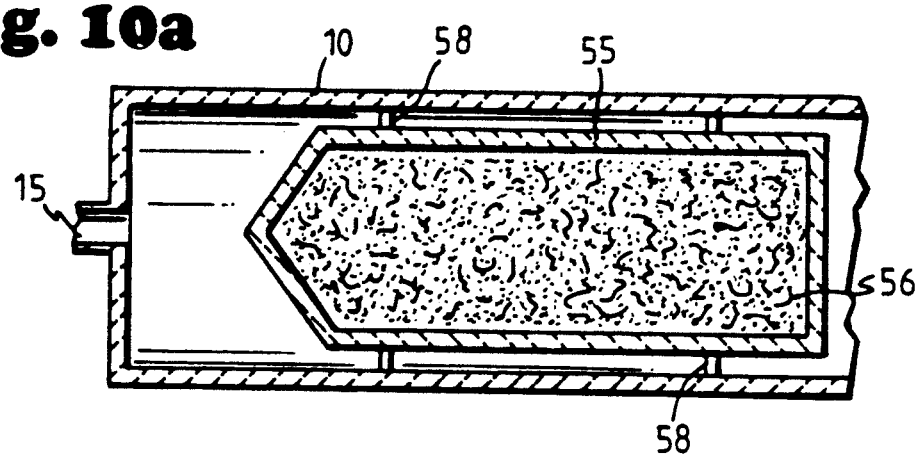
FIGS. 10a, 10b and 10c are elevation views in section of a gas entry section of a furnace similar to FIG. 1, according to alternative methods of construction of the baffle.
Figure 10B:
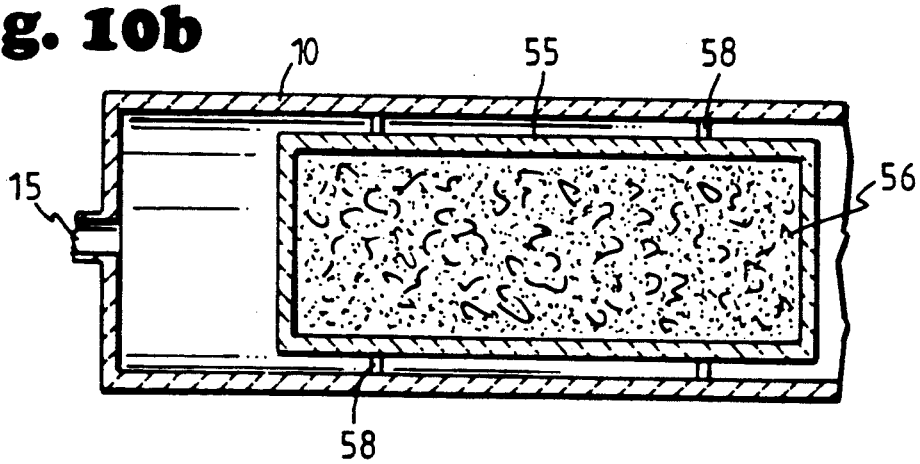
Figure 10C:
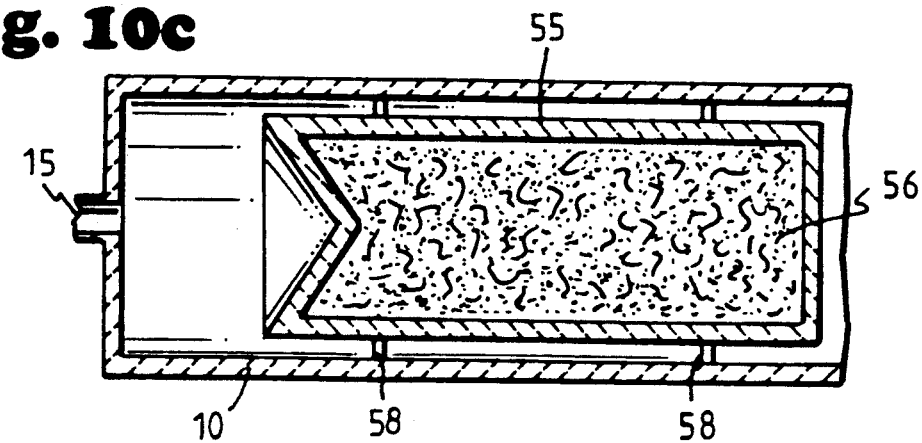

The geometry of the baffle 55 (especially the shape of its front facet) is very important in its effectiveness in dealing with the incoming gas jet. Depending on the application, one may choose from a variety of baffle shapes. Three such shapes are shown in FIGS. 10a, 10b, and 10c, in this case with a squared inlet area instead of the conical inlet 40 of FIG. 1. The only difference among these shapes is the geometry of the front facet. The baffle shape is not limited to these illustrated configurations and may take on other shapes depending on the application.

It should be noted that the configuration shown in FIG. 10a, due to its superior fluid dynamics, will be the least effective in confining the entering gas jet. Through similar reasoning, the configuration shown in FIG. 10c will be the most effective; this configuration is seen also in the preferred embodiment of FIG. 2a.

As illustrated in FIGS. 1 and 2a, it preferred that the invention be used in conjunction with the conical inlet nozzle design described in U.S. Pat. No. 5,064,367. This configuration minimizes regions of gas recirculation in the entrance region and improve the filling efficiency in that region. This configuration can be used in most thermal processing furnaces regardless of whether they are of the cantilever type of U.S. Pat. No. 4,992,044, or U.S. Pat. No. 4,543,059, or other types of cantilevers. However, furnaces which are equipped with the cantilevers of the type in U.S. Pat. No. 4,543,059 or the other patents mentioned above will benefit even more if the baffle of this invention is incorporated in a way such that it is combined with the conical inlet geometry as well as the annular barrier 51 for reducing regions of gas recirculation in a thermal processing furnace, again as seen in FIG. 1.

The most important benefit of the baffle 55 is its ability to ensure uniform $SiO_2$ growth rates across the entire wafer load. Attainment of such uniformities improves equipment throughput and reduces the costs of operation. The fact that gas turbulence is reduced drastically within the chamber may also reduce particle densities within the reactor, and hence increase device yields.

The use of a baffle 55, especially in conjunction with the annular barrier 51, provides the advantage of using less process gas compared to prior furnaces of similar specifications, hence resulting in considerably lower operating costs. For example, consider a typical furnace system used for thermal oxidation of 6-inch silicon wafers. For example, the system may be equipped with a 200-wafer load. At 900° C., in order to attain gas residence times of about 35-seconds, the system would have to have a continuous purge of 27-liters per minute of inert or process gas (35-seconds, or less, is necessary in order to minimize transient characteristics typically observed in switching from one gas to another during short oxidation intervals). In the course of a year (365 days, 3 shifts), each such furnace tube, running typical thermal silicon oxidation processes, will consume approximately 19-million liters of inert gas ($N_2$ or Ar) and 1.1-million liters of reaction gas ($O_2$). Nitrogen costs slightly less than oxygen and argon. Although at present, house nitrogen is used as the inert gas, more stringent process specifications may require that house argon be used for critical thermal processes. Also, present house gases have purity specification suitable for existing CMOS processes, but advanced processes may require purer gases, so prices may actually become three to five times higher. Thus, in the future, if argon is used instead of nitrogen as the inert gas, the annual, per furnace tube, gas consumption cost will increase by tens of thousands of dollars, so the savings by use of features of the invention can be substantial.

In the types of furnace systems described above, the outer annular region 50 accounts for approximately 40-percent of the total reactor void volume. Therefore, by employing the features of the invention, gas consumption can be reduced by 40-percent and acceptable mean residence times within the reactor still be maintained.

While this invention has been described with reference to a specific embodiment, this description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments as fall within the true scope of the invention.

What is claimed is:
1. A thermal processing furnace, comprising:
a) a furnace tube having an elongated cylindrical heated chamber open at one end for receiving articles to be processed;
b) a cantilever tube supported for movement into and out of said one end of said furnace tube, said cantilever tube containing said articles; said cantilever tube having an outer diameter which is less than an inner diameter of said chamber whereby an annular space exists between said cantilever tube and said chamber of said furnace tube when said cantilever tube is moved into said one end of said furnace tube;
c) an inlet for introducing reactant and/or inert gases into the other end of said cylindrical chamber;
d) and an annular barrier located in said chamber and affixed to and extending radially from an interior wall of furnace tube near said other end for preventing said gases from entering said annular space between said interior wall of said furnace tube and an exterior wall of said cantilever tube.

2. Apparatus according to claim 1, wherein said articles are semiconductor wafers.

3. Apparatus according to claim 2 wherein said furnace includes a cylindrical quartz tube, and said inlet is a part of an end of said quartz tube.

4. Apparatus according to claim 3 wherein said furnace has a cylindrical shape of substantially constant exterior diameter extending from said one end to about the position of said inlet.

5. Apparatus according to claim 4 wherein said cantilever tube engages said annular barrier when moved into said furnace tube.

6. Apparatus according to claim 1 wherein inlet includes a conical portion.

7. Apparatus according to claim 6 wherein said barrier and said conical portion are together fixed to said furnace tube.

8. A thermal processing furnace, comprising:
 a) a furnace tube having an elongated cylindrical heated chamber open at one end for receiving articles to be processed;
 b) a cantilever tube supported for movement into and out of said one end of said furnace tube, said cantilever tube containing said articles;
 c) an inlet for introducing reactant and/or inert gases into the other end of said cylindrical chamber; wherein said inlet includes a conical portion;
 d) and an annular barrier located in said chamber near said other end for preventing said gases from entering an annular space between an interior wall of said furnace tube and an exterior wall of said cantilever; said barrier and said conical portion being integrally connected, and wherein said barrier and said conical portion are together fixed to said furnace tube.

9. Apparatus according to claim 8, wherein said articles are semiconductor wafers.

10. Apparatus according to claim 8 wherein said furnace includes a cylindrical quartz tube, and said inlet is a part of an end of said quartz tube, and wherein said annular barrier is affixed to the interior of said quartz tube.

11. Apparatus according to claim 8 wherein said furnace has a cylindrical shape of substantially constant exterior diameter extending from said one end to about the position of said inlet.

12. Apparatus according to claim 8 wherein said cantilever tube engages an edge of said annular barrier when moved into said furnace tube.

13. A method of operating a cantilever-type furnace for performing high-temperature processes upon semiconductor wafers, comprising the steps of:
 a) loading a plurality of semiconductor wafers into a tubular cantilever, and supporting said tubular cantilever at an outer end for axial movement into one end of a furnace tube from a loading position spaced from said furnace tube to an operating position within said furnace tube for performing said processes; said tubular cantilever having an outer wall with an outer diameter which is less than an inner diameter of an inner wall of said chamber whereby an annular space exists between said tubular cantilever and said furnace tube when said tubular cantilever is moved into said operating position within said furnace tube;
 b) introducing reactant and/or inert gases by an inlet into the other end of said furnace tube while said tubular cantilever is in said operating position;
 c) and preventing said gases from said inlet to said furnace tube from entering said annular space between said outer wall of said tubular cantilever and said inner wall of said furnace tube, by employing an annular barrier affixed to and extending radially from an inner wall of said furnace tube and surrounding said tubular cantilever and located at an inner end of said tubular cantilever.

14. A method according to claim 13 including the step of moving said tubular cantilever into said furnace tube until said inner end engages said annular barrier.

15. A method according to claim 14 wherein said furnace tube includes a quartz cylinder of substantially uniform inner diameter.

16. A method according to claim 15 wherein said annular barrier is composed of quartz.

17. A method according to claim 16 wherein said inlet includes a conical portion integral with said annular barrier.

* * * * *

UNITED STATES PATENT AND TRADEMARK OFFICE
CERTIFICATE OF CORRECTION

PATENT NO. : 5,256,060
DATED : October 26, 1993
INVENTOR(S) : Ara Philipossian and Edward W. Culley It is certified that error appears in the above-indentified patent and that said Letters Patent is hereby corrected as shown below:

Column 1, line 7, after "discloses" add --subject--.

Column 3, line 67, "Ibis" should be --This--.

Column 6, line 61, "Ibis" should be --This--.

Column 6, line 65, "comers" should be --corners--.

Signed and Sealed this

Ninth Day of August, 1994

Attest:

BRUCE LEHMAN

Attesting Officer   Commissioner of Patents and Trademarks